United States Patent
Cotte et al.

(10) Patent No.: US 6,933,186 B2
(45) Date of Patent: Aug. 23, 2005

(54) METHOD FOR BEOL RESISTOR TOLERANCE IMPROVEMENT USING ANODIC OXIDATION

(75) Inventors: John M. Cotte, New Fairfield, CT (US); Kenneth J. Stein, Sandy Hook, CT (US); Seshadri Subbanna, Brewster, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 720 days.

(21) Appl. No.: 09/961,009

(22) Filed: Sep. 21, 2001

(65) Prior Publication Data

US 2003/0059992 A1 Mar. 27, 2003

(51) Int. Cl.⁷ .............................................. H01L 21/337
(52) U.S. Cl. ........................ 438/190; 438/192; 438/193; 438/645; 438/662; 438/693; 438/708; 438/745
(58) Field of Search ................................ 438/190, 645, 438/662, 693, 708, 745, 752, 192, 193

(56) References Cited

U.S. PATENT DOCUMENTS

| | | | |
|---|---|---|---|
| 3,644,188 A | * | 2/1972 | Sharp et al. ............ 204/192.15 |
| 3,781,610 A | * | 12/1973 | Bodway ...................... 257/310 |
| 3,786,557 A | * | 1/1974 | Bodway ........................ 29/620 |
| 3,988,824 A | * | 11/1976 | Bodway ......................... 216/16 |
| 4,020,222 A | * | 4/1977 | Kausche et al. ............ 428/209 |
| 4,358,748 A | * | 11/1982 | Gruner et al. ................ 338/25 |
| 5,620,905 A | | 4/1997 | Konuma et al. |
| 5,893,731 A | | 4/1999 | Lee et al. |
| 5,904,509 A | | 5/1999 | Zhang et al. |
| 6,251,787 B1 | * | 6/2001 | Edelstein et al. ........... 438/692 |

* cited by examiner

*Primary Examiner*—David Nelms
*Assistant Examiner*—Renee R. Berry
(74) *Attorney, Agent, or Firm*—Scully, Scott, Murphy & Presser; H. Daniel Schnurmann

(57) ABSTRACT

A method of improving the tolerance of a back-end-of-the-line (BEOL) thin film resistor is provided. Specifically, the method of the present invention includes an anodization step which is capable of converting a portion of base resistor film into an anodized region. The anodized resistor thus formed has a sheet resistivity that is higher than that of the base resistor film.

18 Claims, 3 Drawing Sheets

METHOD FOR BEOL RESISTOR TOLERANCE IMPROVEMENT USING ANODIC OXIDATION

FIELD OF THE INVENTION

The present invention relates to high-performance integrated circuits (ICs), and more particularly to a method of fabricating a back-end-of-the-line (BEOL) thin film resistor wherein anodic oxidation is employed to adjust sheet resistance of the BEOL thin film resistor.

BACKGROUND OF THE INVENTION

Semiconductor structures and ICs are manufactured using a wide variety of well-known techniques. In the manufacturing of semiconductor devices or ICs, active/passive components are formed on a semiconductor wafer or chip, and then interconnected in a desired manner.

In such semiconductor structures and ICs, it is well known to form thin film resistors using either a damascene method or a subtractive etch method in the back-end-of-the-line of the semiconductor wafer or chip. The term "back-end" is used herein to denote BEOL interconnect or wiring levels. BEOL thin film resistors are typically formed inlaid or on top of a dielectric material which is in electrical communication with the underlying semiconductor chip or wafer by means of one or more conductive vias.

BEOL thin film resistors are preferred over other types of resistors because of their lower parasitics. A major drawback with such resistors is that the sheet resistivity of the various resistors formed over the entire wafer or chip may vary and, in some instances, go beyond specifications for high-performance ICs. That is, some of the BEOL resistors formed across a wafer or chip may have a sheet resistance that is beyond the tolerance of current high-performance ICs due to non-uniform thickness deposition.

In the semiconductor industry, it is important to control the tolerance of the BEOL thin film resistor because the tolerance directly affects the circuit design, speed, and manufacturability; i.e., ability to meet circuit performance specifications. To date, however, there are no satisfactory means to control the tolerance of BEOL thin film resistors. Typically, wafers are sorted to specification, and the wafers out of specification are scrapped. Hence, there is a need for providing a method which is capable of improving the tolerance of BEOL thin film resistors to yield more chips in-specification.

SUMMARY OF THE INVENTION

One object of the present invention is to provide a method of fabricating a BEOL thin film resistor. The term "thin film resistor" is used herein to denote a conductive material that has a thickness of about 100 nm or less, with a thickness of from about 20 to about 50 nm being more highly preferred.

Another object of the present invention is to provide a method of fabricating a BEOL thin film resistor in which the tolerance of the resistor is improved.

A further object of the present invention is to provide a method of fabricating a BEOL thin film resistor in which the tolerance of the resistor is controlled so as to meet current circuit designs, speeds and manufacturability specifications.

A yet further object of the present invention is to provide a method of fabricating a BEOL thin film resistor that has an adjustable and controllable sheet resistivity in which the processing steps employed are compatible with existing BEOL processing steps.

These and other objects and advantages are achieved in the present invention by utilizing an anodic oxidation step to adjust sheet resistivity of a BEOL thin film resistor. The inventive method is based upon an anodization step which serves to oxidize part of a previously deposited base resistor film so as to converge resistance of the base resistor film to a final and desirable resistance value.

In broad terms, the inventive method comprises the steps of:

(a) forming a base resistor film on at least one interconnect level of an integrated circuit, said base resistor film having a first sheet resistivity value;

(b) subjecting said base resistor film to anodic oxidation so as to convert a portion of said base resistor film into an anodized region thereby increasing the first sheet resistivity value to a second sheet resistivity value; and (c) removing portions of said base resistor film and anodized region so as to form at least one trimmed resistor having said second sheet resistivity value on said at least one interconnect level.

In some embodiments of the present invention, the inventive method is used in conjunction with a damascene method, while in other embodiments, the inventive method is used in conjunction with a subtractive etch method.

In yet another embodiment of the present invention, the sheet resistivity of the base resistor film is determined in-situ prior to anodic oxidation. If the measured sheet resistivity value is within a predetermined specification, then the inventive method is halted. If, however, the measured sheet resistivity value of the base resistor film is not within the predetermined specification, the base resistor film is subjected to anodic oxidation.

In such an instance, calculations can be carried out to determine how much of the base resistor film needs to be removed by anodization. By using existing calibrations, this thickness can be converted to the voltage which is needed to be applied to the anodizing bath. A certain thickness of the base resistor film is therefore removed (i.e., 'trimmed') by conversion into an anodized region, which is typically an insulating oxide region. If desired, the sheet resistivity value of the trimmed base resistor film can be re-measured and further anodization, as warranted, may be performed.

The equation used in the present invention for determining the voltage required to be applied during anodization is as follows:

$$V_{ANOD} = \left(\frac{\Delta R}{R_i \times C_A}\right) t$$

wherein
$V_{ANOD}$=Anodization voltage (volts);
$\Delta R$=Resistance change (ohms);
$R_i$=Initial resistance (ohms);
$C_A$=Anodization factor (Angstroms/volts);
t=Initial film thickness (Angstroms).

The present invention also contemplates a means to control the local anodization thickness by adjusting the electrolyte flow to improve the within-wafer variation. In this way, any base resistor film that is thicker than current specifications can be adjusted into the current specifications. In order to achieve better tolerance control, the deposited base resistor film should be somewhat slightly thicker than the final desired specification.

DETAILED DESCRIPTION OF THE INVENTION

Figure 1A:
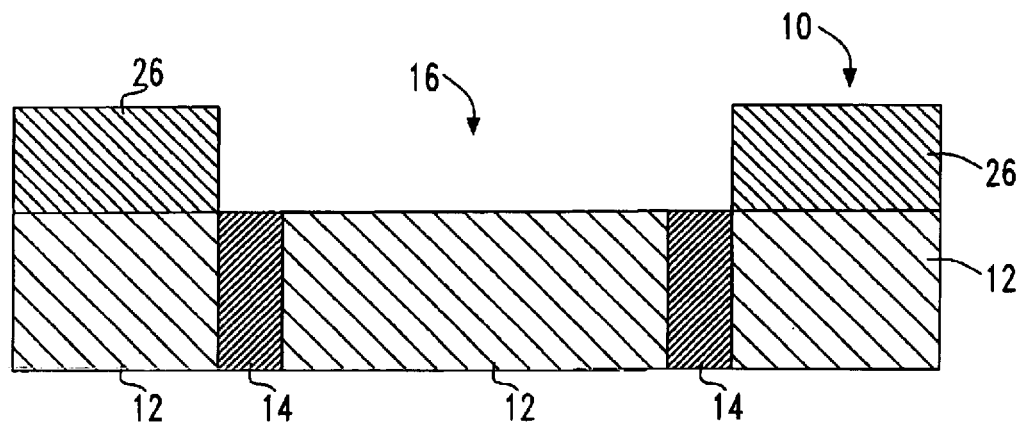
FIGS. 1A–1D are pictorial representations (through cross-sectional views) showing the various processing steps employed in one embodiment of the present invention, e.g., a damascene method.

The present invention, which provides a method of improving the tolerance of a BEOL thin film resistor, will now be described in greater detail by referring to the drawings that accompany the present application. It is noted that in the accompanying drawings, like and/or corresponding elements are referred to by like reference numerals.

Reference is first made to FIGS. 1A–1D which are pictorial representations showing the various processing steps employed in one embodiment of the present invention. Specifically, FIGS. 1A–1D show an embodiment of the present invention wherein anodic oxidation is employed in conjunction with a damascene process to form a trimmed BEOL thin film resistor having improved resistor tolerance.

In the damascene embodiment of the present invention, the initial structure shown in FIG. 1A is first provided. Specifically, the structure shown in FIG. 1A comprises a patterned interconnect level 10 that includes dielectrics 12 and 26 which has conductively filled vias 14 formed therein. The conductively filled vias, which are formed within resistor opening 16, are either in contact with a prior interconnect level (not shown), or the backside surface of a semiconductor wafer or chip (also not shown).

The initial structure shown in FIG. 1A is comprised of conventional materials well known to those skilled in the art and the structure is formed using conventional processing steps that are also well known in the art. For example, dielectric 12 is formed atop either another interconnect level or the backside surface of a semiconductor chip or wafer using a conventional deposition process well known in the art including, but not limited to: chemical vapor deposition (CVD), plasma-assisted CVD, sputtering, evaporation, chemical solution deposition, atomic layer deposition, spin-on coating or any other like deposition process.

Dielectric 12 is comprised of any conventional inorganic or organic insulating material which is commonly employed as an interconnect level for an IC. Suitable inorganic dielectrics that can be employed in the present invention include, for example, oxides, nitrides and oxynitrides. A highly preferred inorganic dielectric employed in the present invention as dielectric 12 is $SiO_2$. Illustrative examples of suitable organic dielectrics that can be employed in the present invention include, but are not limited to: polyimides, polyamides, benzocyclobutene, silsequioxanes, organosilanes, and aromatic thermosetting resins such as SiLK® sold by DOW Chemical Company or Flare® sold by Honeywell, as well as other organic dielectrics. It should be noted that dielectric 12 may comprise a dielectric stack including two or more dielectric materials.

After forming dielectric 12, the dielectric is patterned utilizing conventional lithography and etching so as to provide via openings (not specifically shown) in dielectric 12. The vias are then filled with a conductive material, such as Al, Cu, W, Ta, Pt, Pd, or alloys or nitrides thereof, utilizing a conventional deposition process well known in the art so as to form conductively filled vias 14. Illustrative examples of such deposition processes include, but are not limited to: CVD, plasma-assisted CVD, evaporation, plating, and chemical solution deposition. A planarization process such as chemical mechanical polishing or grinding follows the filling of the vias.

Following the planarization of the via, a second dielectric layer (26), which may be the same or different from the first dielectric layer, is deposited and thereafter resistor opening 16 is formed in the second dielectric layer using conventional lithography and etching.

Figure 1B:
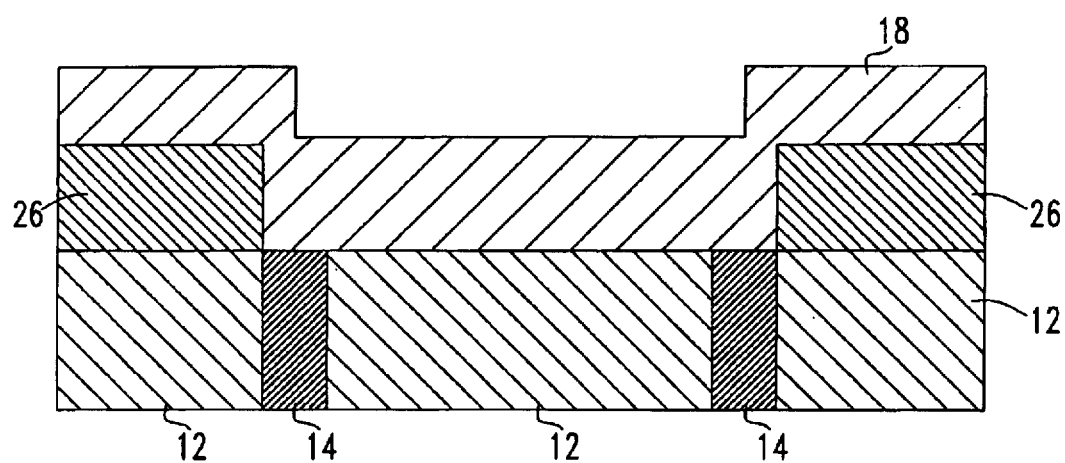

Next, and as shown in FIG. 1B, base resistor film 18 having a first sheet resistivity value is formed over all exposed surfaces of patterned interconnect 10 including dielectric 26 and conductively filled vias 14. Specifically, the base resistor film is formed utilizing a conventional deposition process such as CVD, plasma-assisted CVD, evaporation, chemical solution deposition, plating and other like deposition processes.

The first sheet resistivity value of the base resistor film may vary depending upon the resistor material employed as well as the thickness of the film after deposition. In accordance with the present application, the first sheet resistivity value of the base resistor film is above a second sheet resistivity value which meets current specifications for use in high-performance ICs. Hence, trimming of the first sheet resistivity value of the base resistor film to the second sheet resistivity value is required.

Base resistor film 18 is comprised of any conductive material including, but not limited to: Al, Cu, W, Ta, Pt, Pd, or alloys and nitrides thereof. Preferably, the base resistor film is comprised of a conductive metal nitride such as TaN. The thickness of the deposited base resistor film may vary, but typically it is preferred to deposit a targeted thickness that is from about 10 to about 20% thicker than needed to form the final resistor. In accordance with the present invention, the base resistor film has a thickness after deposition of from about 10 to about 100 nm, with a thickness of from about 20 to about 50 nm being more highly preferred.

Note that thicker base resistor films can be employed in the present invention since the subsequent anodized oxidation step is employed to trim the base resistor film to a thickness which is capable of providing a desired and targeted second sheet resistivity value. The desired and targeted second resistivity value is predetermined and meets current specifications for high-performance ICs. Specifically, the desired and targeted second sheet resistivity is between about 10 to about 1000 ohms per square, with a second sheet resistivity of from about 50 to about 100 ohms per square being more highly preferred.

At this point of the present invention, it is possible to in-situ measure the sheet resistivity of the base resistor film and to convert the same into an actual thickness value. The in-situ measurement and conversion are carried out using conventional processes well known in the art. For example, the sheet resistivity is measured by a four point probe or any other resisitivity measuring tool and the conversion of sheet resistivity to thickness is determined by the bulk resistivity of the material (ohm×cm) divided by the sheet sheet resistance (ohms).

After deposition of the base resistor film and possible in-situ thickness determination, the structure shown in FIG. 1B is then subjected to an anodized oxidation step which is capable of converting a portion of the base resistor film into an insulating region. The insulating, i.e., anodized, region is labeled as 20 in FIG. 1C. Note that the anodized region (i.e., region 20) consumes a desired portion of the base resistor film thereby "trimming" the sheet resistivity to a value that is above that of the initial base resistor film. The anodized region provided in this manner is highly uniform so that all resistors with a given wafer or chip are trimmed identically.

The anodized oxidation (hereinafter referred to as anodization) step of the present invention is the electrochemical formation of an insulating region such as an oxide from a precursor metal. The precursor metal, in this case the base resistor film, is consumed or transformed during the anodization process to form an insulating region having a thickness that is proportional to the applied voltage. It has been shown that the insulating region formations takes places due to the diffusion of both oxygen and metal ions under a high-electrical field. In the case of Ta or TaN precursor in dilute aqueous electrolytes, the oxide-insulating region formed is amorphous and has a growth factor of about 19–20 Angstroms/volts, and a consumption factor of about 8 Angstroms/volts. The close control of anodized region thickness and precursor consumption provides a means of adjusting the sheet resistance of the precursor film. The anodic thickness is defined by a self-limiting mechanism and has been shown to have a thickness uniformity with a standard deviation of less than 1% across a 200 nm wafer.

In accordance with the present invention, anodization of the structure shown in FIG. 1B occurs in an electrochemical bath which comprises an electrolytic solution, such as citrate acid, which is capable of forming an anodized region in the base resistor film during the anodization processing step. An anodization cathode is also placed within the bath and a direct current power supply supplies the voltage for the anodization process.

In the present invention, the applied voltage may vary depending upon the thickness of the deposited base resistor film (i.e., initial sheet resistivity) as well as the desired and targeted sheet resistivity of the final resistor. The exact applied voltage needed for trimming can be calculated using the following equation:

$$V_{ANOD} = \left(\frac{\Delta R}{R_i \times C_A}\right) t$$

wherein
$V_{ANOD}$=Anodization voltage (volts);
$\Delta R$=Resistance change (ohms);
$R_i$=Initial resistance (ohms);
$C_A$=Anodization factor (Angstroms/volts);
t=Initial film thickness (Angstroms).

An example calculation using the above equation and a TaN base resistor film ($C_A$=7.6 Angstroms/volts) having an initial resistivity, $R_i$, of 400 ohms, an initial thickness of 200 Å, and a desired resistance of 500 ohms is as follows:

$$V_{ANOD} = \left(\frac{100 \text{ ohms}}{400 \text{ ohms} \times 7.6 \text{ Å/V}}\right) \cdot 200\text{Å} = 6.6 \text{ volts}$$

Although various applied voltages can be employed, the anodization processing step of the present invention is typically carried out using an applied voltage of from about less than 1 to about 100 volts for a time period of from about 1 to about 30 minutes. More preferably, the anodization processing step of the present invention is typically carried out using an applied voltage of from about less than 1 to about 25 volts for a time period of from about 1 to about 15 minutes.

Figure 1C:
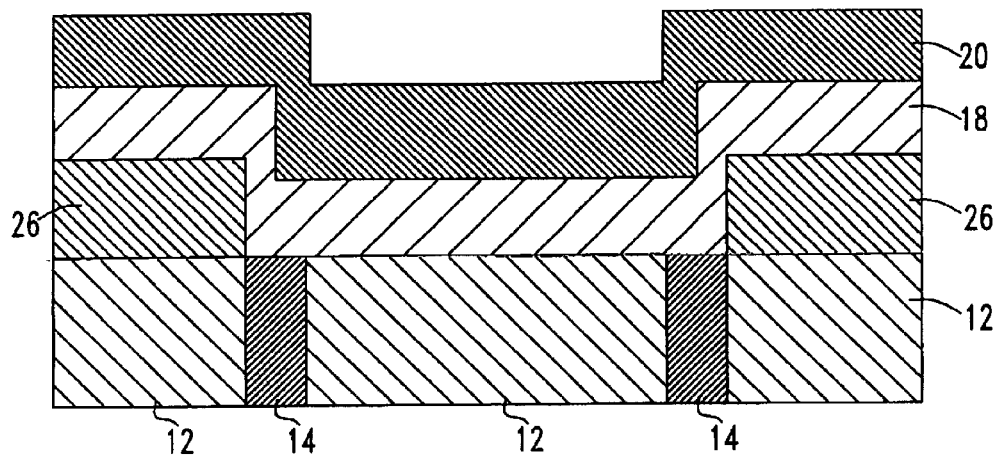

Following the anodization step, the structure is removed from the electrolytic bath and the structure shown in FIG. 1C is provided. The structure shown in FIG. 1C is then subjected to a processing step wherein selective portions of both the anodized region and base resistor film that are not within resistor opening 16 are removed. Specifically, in the damascene embodiment of the present invention, the extraneous films, i.e., portions of anodized region 20 and base resistor film 18 that are not within resistor opening 16, are removed by a conventional planarization process such as chemical mechanical polishing (CMP) or grinding, stopping on second dielectric 26.

Figure 1D:
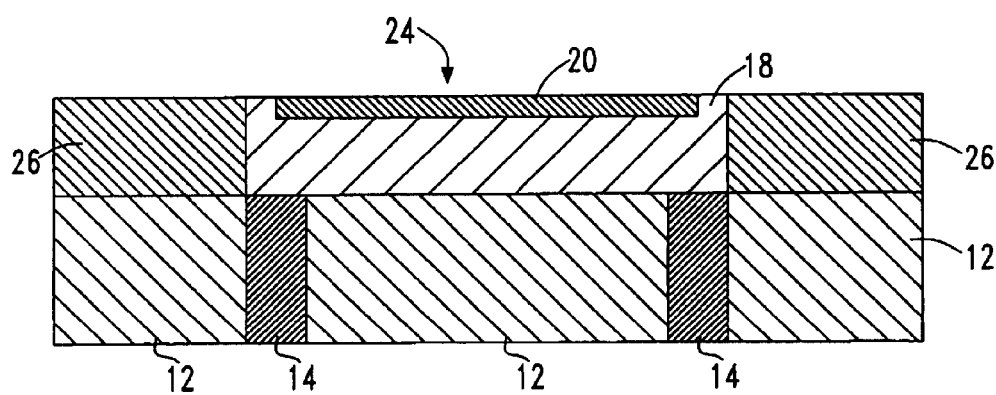

The planarization process provides the structure shown in FIG. 1D. Note that the final trimmed resistor (labeled as 24), which includes base resistor film 18 and anodized region 20, is formed within the resistor opening and that the top surface layer thereof is coplanar with dielectric 26.

It is noted that although the drawings show the formation of one resistor within dielectric 26, the present invention also is applicable for cases wherein more than one resistor (trimmed as mentioned above) is formed within dielectric 26.

It is also noted that the processing steps of determining the sheet resistivity of the resistor, anodization, and planarization may be repeated any number of times so as to bring the base resistor film into a sheet resistivity value that is tolerable for high-performance ICs.

Figure 2A:
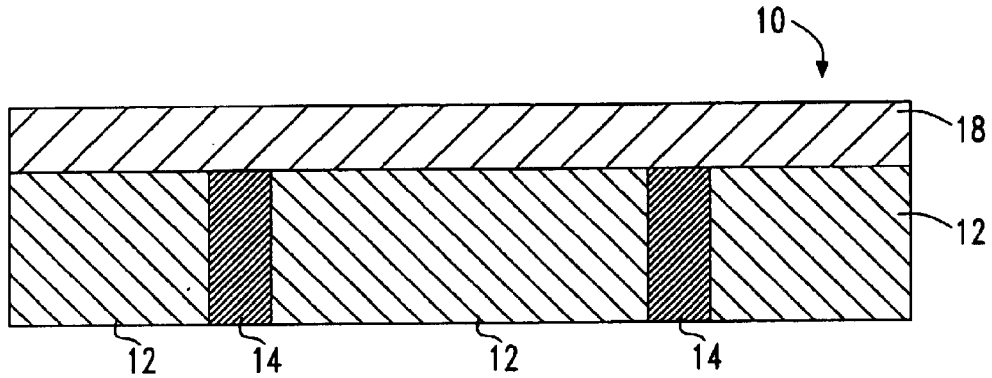
FIGS. 2A–2C are pictorial representations (through cross-sectional views) showing the various processing steps employed in one embodiment of the present invention, e.g., a subtractive etch method.
Figure 2B:
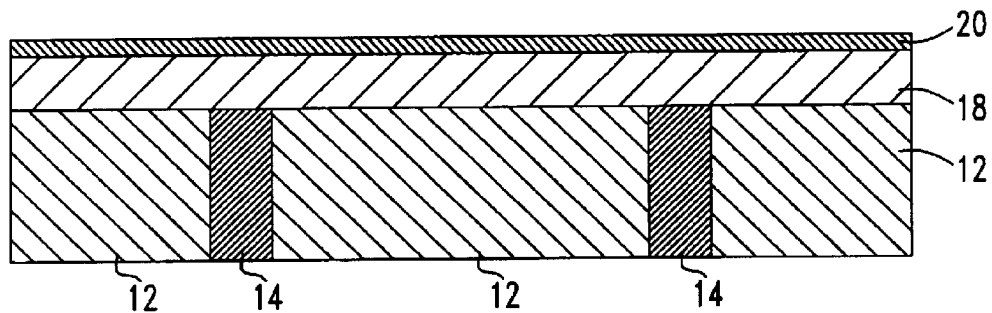
Figure 2C:
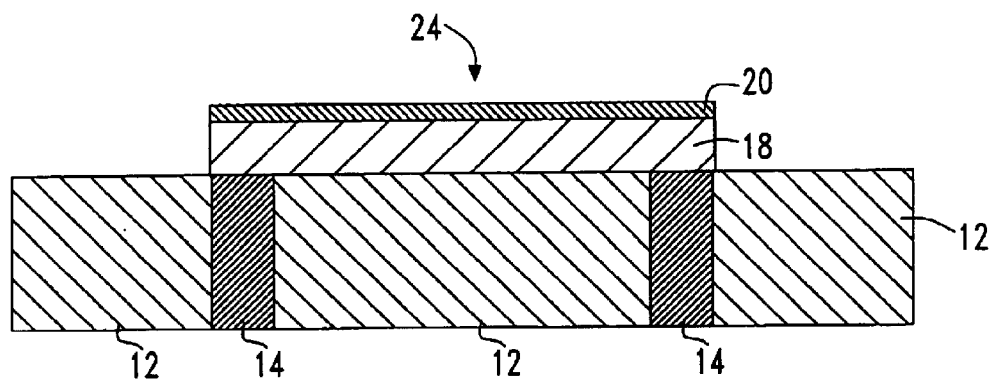

Reference is now made to FIGS. 2A–2C which are pictorial representations (through cross-sectional views) showing the various processing steps employed in one alternative embodiment of the present invention wherein a subtractive etch method is employed.

FIG. 2A is the structure that is formed after base resistor film 18 having a first sheet resistivity value is formed atop interconnect structure 10. Interconnect structure 10 includes dielectric 12 and conductive filled vias 14 formed therein. Note that in this embodiment of the present invention, interconnect structure 10 is not patterned thus it does not include a resistor opening formed therein.

FIG. 2B shows the structure that is obtained after subjecting the structure of FIG. 2A to the above mentioned anodization process. Note that the anodization process forms anodized region 20 over based resistor film 18.

FIG. 2C shows the structure that is formed after selectively removing portions of the anodized region and the base resistor film so as to form patterned final resistor 24 that is non-coplanar with the top surface of interconnect level 10. In this embodiment, the patterned resistor is formed utilizing conventional lithography and etching. The etching step includes the use of a selective etching process such as reactive-ion etching (RIE) wherein a chemical etchant that is highly selective in removing exposed portions of the anodized region and the base resistor film is employed. It is also possible to remove the anodized region shown in FIG. 2C so as to provide a structure that contains only patterned base resistor film that has a trimmed sheet resistivity value.

In yet another embodiment of the present invention, the lithography step mentioned above is omitted, and only the anodized region is removed from atop the trimmed base resistor film.

As was the case with the damascene embodiment mentioned above, the subtractive etching embodiment mentioned herein also contemplates the in-situ measurement of the first resistivity value of the deposited base resistor film prior to anodization. Additionally, this embodiment also contemplates repeating the steps of measuring, anodization, and etching.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method for improving the tolerance of a back-end-of-the-line (BEOL) thin film resistor comprising:
   (a) forming a base resistor film on at least one interconnect level of an integrated circuit, said base resistor film having a first sheet resistivity value;
   (b) subjecting said base resistor film to anodic oxidation so as to convert a portion of said base resistor film into an anodized region thereby increasing the first sheet resistivity value to a second sheet resistivity value; and
   (c) removing portions of said base resistor film and anodized region so as to form at least one trimmed resistor having said second sheet resistivity value on said at least one interconnect level.

2. The method of claim 1 wherein said at least one interconnect level is a patterned interconnect level that is comprised of at least one dielectric, conductively filled vias and at least one resistor opening.

3. The method of claim 1 wherein said at least one interconnect level is an unpatterned interconnect level that is comprised of at least one dielectric, and conductively filled vias.

4. The method of claim 1 wherein said first sheet resistivity value is dependent on the thickness of said base resistor film.

5. The method of claim 1 wherein following the forming of the base resistor film and prior to anodic oxidation an in-situ measurement of said first sheet resistivity value is determined.

6. The method of claim 1 wherein said anodic oxidation comprises applying a voltage to an electrolytic bath, wherein said voltage is based on the following equation:

$$V_{ANOD} = \left(\frac{\Delta R}{R_i \times C_A}\right) t$$

wherein
   $V_{ANOD}$=Anodization voltage (volts);
   $\Delta R$=Resistance change (ohms);
   $R_i$=Initial resistance (ohms);
   $C_A$=Anodization factor (Angstroms/volts);
   t=Initial film thickness (Angstroms).

7. The method of claim 6 wherein said anodic oxidation is carried out at a voltage of from about less than 1 to about 100 volts for a time period of from about 1 to about 30 minutes.

8. The method of claim 1 wherein said base resistor film has a thickness that is from about 10 to about 20% thicker than that present in said at least one trimmed resistor.

9. The method of claim 1 wherein said base resistor film is TaN.

10. The method of claim 1 wherein said at least one trimmed resistor provided in step (c) is coplanar with a top surface of said at least one interconnect level.

11. The method of claim 10 wherein step (c) comprises a planarization process selected from the group consisting of chemical mechanical polishing and grinding.

12. The method of claim 1 wherein said at least one trimmed resistor provided in step (c) is non-coplanar with at top surface of said at least one interconnect level.

13. The method of claim 12 wherein step (c) comprises lithography and etching.

14. The method of claim 12 wherein step (c) comprises etching of only the anodized region.

15. The method of claim 1 wherein said at least one trimmed resistor is a patterned resistor.

16. A method for improving the tolerance of a back-end-of-the-line (BEOL) thin film resistor comprising:
   (a) forming a base resistor film on at least one interconnect level of an integrated circuit;
   (b) measuring the base resistor film's thickness and converting the same to a first sheet resistivity value;
   (c) subjecting said base resistor film to anodic oxidation so as to convert a portion of said base resistor film into an anodized region thereby increasing the first sheet resistivity value to a second sheet resistivity value; said anodic oxidization comprising using an applied voltage that is based on the following equation:

$$V_{ANOD} = \left(\frac{\Delta R}{R_i \times C_A}\right) t$$

wherein
   $V_{ANOD}$=Anodization voltage (volts);
   $\Delta R$=Resistance change (ohms);
   $R_i$=Initial resistance (ohms);
   $C_A$=Anodization factor (Angstroms/volts);
   t=Initial film thickness (Angstroms); and
   (d) removing portions of said base resistor film and anodized region so as to form at least one trimmed resistor having said second sheet resistivity value on said at least one interconnect level.

17. The method of claim 16 wherein steps (b)–(d) are repeated any number of times.

18. A method for improving the tolerance of a back-end-of-the-line (BEOL) thin film resistor comprising:
   forming a base resistor film on at least one interconnect level of an integrated circuit, said base resistor film having a first sheet resistivity value;
   subjecting said base resistor film to anodic oxidation so as to convert a portion of said base resistor film into an anodized region thereby increasing the first sheet resistivity value to a second sheet resistivity value; and
   removing portions of said base resistor film and anodized region so as to form at least one trimmed resistor having said second sheet resistivity value on said at least one interconnect level, wherein said anodic oxidation comprises applying a voltage to an electrolytic bath, said voltage being based on the following equation:

$$V_{ANOD} = \left(\frac{\Delta R}{R_i \times C_A}\right) t$$

wherein
   $V_{ANOD}$=Anodization voltage (volts);
   $\Delta R$=Resistance change (ohms);
   $R_i$=Initial resistance (ohms);
   $C_A$=Anodization factor (Angstroms/volts);
   t=Initial film thickness (Angstroms).

* * * * *